US005515240A

United States Patent [19]
Rodeffer et al.

[11] Patent Number: 5,515,240
[45] Date of Patent: May 7, 1996

[54] SELF-LOCKING HOUSING INCLUDING TABS THAT BEAR AGAINST THE SIDES OF A PRINTED CIRCUIT BOARD TO ENTRAP THE PRINTED CIRCUIT BOARD

[75] Inventors: Charles E. Rodeffer; Randy L. Sperry, both of Burlington, Iowa

[73] Assignee: Winegard Company, Burlington, Iowa

[21] Appl. No.: 196,692

[22] Filed: Feb. 14, 1994

[51] Int. Cl.$^6$ .............................. H05K 7/12; H05K 5/02
[52] U.S. Cl. ................... 361/759; 206/449; 206/451; 220/324; 220/326; 220/4.21; 361/732; 361/740; 361/752
[58] Field of Search .................... 174/52.1; 206/328, 206/334, 408, 449, 454, 451; 211/41, 26; 220/315, 4.21, 324, 326, DIG. 25, 408, 410; 248/648, 693, 549, 603, 27.1, 27.3, 221.3, 221.4; 361/600, 609, 728, 730, 732, 736, 740, 747, 752, 759, 796, 797, 801, 807, 809, 810; 455/89, 90, 100; 379/426, 433, 455, 451, 453; D14/137, 138, 250, 251, 253; 312/188, 190, 223.1, 223.2

[56] References Cited

U.S. PATENT DOCUMENTS

| | | | |
|---|---|---|---|
| 4,092,698 | 5/1978 | Brefka | 361/752 |
| 4,912,602 | 3/1990 | Zurek et al. | 361/759 |
| 5,001,603 | 3/1991 | Villaneuva, III et al. | 361/759 |
| 5,140,108 | 8/1992 | Miyajima | 174/52.4 |
| 5,353,934 | 10/1994 | Yamauchi | 206/454 |

FOREIGN PATENT DOCUMENTS

| | | | |
|---|---|---|---|
| 3230545 | 2/1984 | Germany | 361/759 |
| 3323604 | 1/1985 | Germany | 361/752 |
| 3328242 | 2/1985 | Germany | 361/732 |
| 2-306699 | 12/1990 | Japan | 361/752 |
| 4-157796 | 5/1992 | Japan | 361/759 |

*Primary Examiner*—Donald A. Sparks
*Attorney, Agent, or Firm*—Dorr, Carson, Sloan & Birney

[57] ABSTRACT

A self-locking housing for an electronic circuit such as a power supply. The self-locking housing includes a printed circuit board carrying an electronic circuit, a bottom housing half, and a top housing half. The bottom housing half has locator tabs placed at one end for holding one end of the printed circuit board in a predetermined position within the interior of the bottom housing. Opposing support tabs are placed at the other end and side support tabs are provided on the side of the bottom housing. The support tabs support the printed circuit board in the bottom housing. Bottom snaps are provided on opposing sides of the bottom housing, and the printed circuit board abuts against the bottom snaps. The top housing has corresponding opposing grooves so that when the top housing is placed over the bottom housing the snaps in the bottom housing snap into the grooves so as to self-lock with the top housing. The locking of the top housing to the bottom housing entraps the PC board, and the sides of the entrapped PC board further prevent the bottom snaps from unlocking from the grooves.

8 Claims, 6 Drawing Sheets

SELF-LOCKING HOUSING INCLUDING TABS THAT BEAR AGAINST THE SIDES OF A PRINTED CIRCUIT BOARD TO ENTRAP THE PRINTED CIRCUIT BOARD

BACKGROUND OF THE INVENTION

1. Related Applications

This Application is related to Power Supply Housing, Ser. No. 2/018,784 filed Feb. 14, 1994 now U.S. Pat. No. Des. 358,365, and Ribbed Power Supply Housing, Ser. No. 29/018,734 filed Feb. 14, 1994 now U.S. Pat. No. Des. 355,887.

2. Field of the Invention

The present invention pertains to electronic circuit housings and, more particularly, the design and assembly of self-locking housings for a power supply.

3. Statement of the Problem

A need exists in the electronic component industry for low-cost housings made of plastic that simply snap together to hold and to entrap an electronic printed circuit board. Such a housing should not use any fasteners whatsoever and the housing should simply snap together so as to be held in place even in environments of rugged use.

A particular need exists for a power supply housing that snaps together without the use of any fasteners or the like. The assembly or manufacturing process should be straightforward, and the assembly should occur from the bottom up in a stacking process. The elimination of fasteners, the ease in manufacturing, and the provision of a housing that stays connected after assembly result in a substantially less expensive power supply (or other electronic product) that still can withstand rugged use.

4. Solution to the Problem

The present invention solves the above-stated problem by providing a self-locking housing for an electronic circuit such as a power supply. The housing of the present invention comprises two halves: an upper encasement half and a lower encasement half. The lower encasement half uses locator tabs and support tabs to precisely position a printed circuit (PC) board within the lower encasement half. The positioned PC board abuts against snaps provided on the sides of the lower encasement half. The upper encasement half self-locks into the snaps so as to entrap the PC board. The entrapped PC board by abutting against the snaps prevents the snaps from unlocking.

SUMMARY OF THE INVENTION

A self-locking housing for an electronic circuit such as a power supply includes a printed circuit board having an electronic circuit, a bottom housing half, and a top housing half. The bottom housing half has locator tabs placed at one end for holding one end of the printed circuit board in a predetermined position within the interior of the bottom housing. Opposing support tabs are placed at the other end and side support tabs are provided on the side of the bottom housing. The support tabs support the printed circuit board in the bottom housing. Snaps are provided on opposing sides of the bottom housing, and the printed circuit aboard abuts against the bottom snaps. The housing has corresponding opposing grooves so that when the top housing is placed over the bottom housing the snaps in the bottom housing snap into the grooves so as to self-lock with the top housing. The locking of the top housing to the bottom housing entraps the PC board, and the sides of the entrapped PC board further prevent the bottom snaps from unlocking from the grooves.

DETAILED SPECIFICATION

1. Overview

Figure 1:
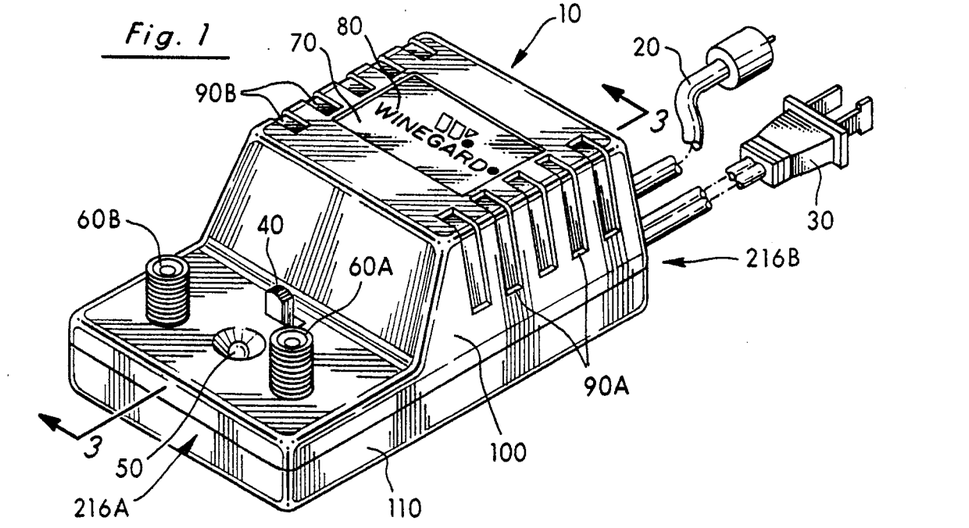
In FIG. 1, a perspective view of an electronic product such as the power supply of the present invention is shown in perspective view.

In FIG. 1, the snap-together power supply 10 of the present invention is shown having an auxiliary power cable 20 and a power cord 30 extending therefrom. The power supply 10 of the present invention has an extending switch 40, a light 50 and two protruding power connection points 60.

The power supply 10 of the present invention functions in a conventional fashion to transform AC power delivered over cable 30 to the interior of the power supply 10. Output power is delivered through F-jacks 60. Switch 40 functions to turn power on or off in connectors 60, and when power is being delivered, light 50 is lit. An auxiliary power cable 20 is also provided although it is to be understood that this is optional. It is also to be understood that switch 40 and light 50 are also optional.

The power supply 10 has a recessed insert 70 carrying the trademark 80 of the power supply. A plurality of ridges 90A and 90B are formed on opposing sides of the power supply 10. The ridges are for ornamental purposes only.

In FIG. 1, the power supply 10 has a top encasement half 100 and a bottom encasement half 110. The configuration of the power supply 10 can be of any desirable design as found in the above-identified related design patent applications.

2. Power Supply 10 Components

Figure 2:
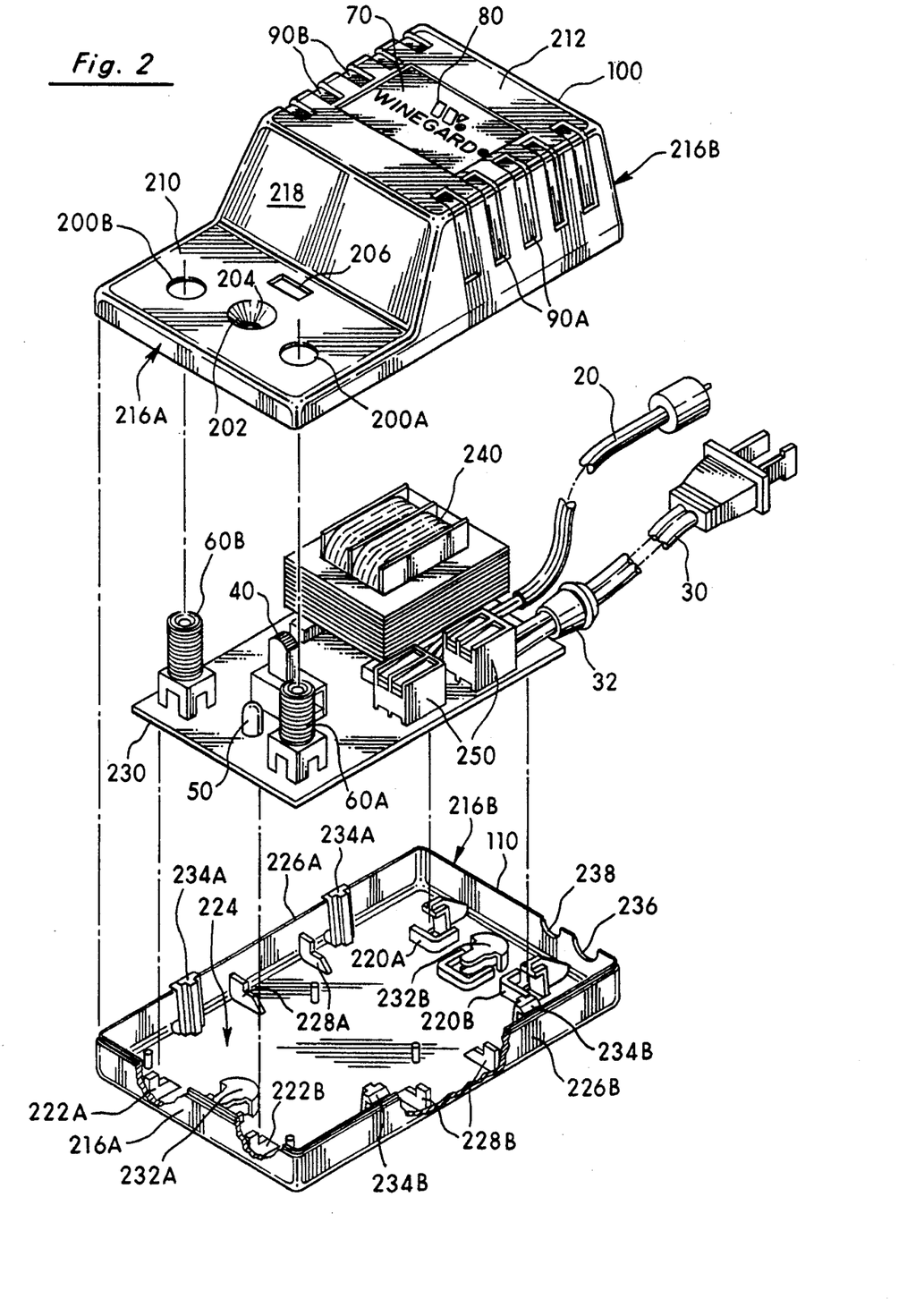
FIG. 2 is an exploded view of the power supply of the present invention.

The top encasement half 100 as shown in FIG. 2 is a single integrated injection-molded plastic piece having holes 200A and 200B formed therein which are receptive of F-jacks 60A and 60B, respectively. An annular inverted cone-shaped region 202 having a formed hole 204 receives the light 50. A rectangular formed slot 206 receives the switch 40. Formed regions 200, 202, 204, and 206 are molded on a flat plateau 210 of the top encasement half 100. A second flat plateau 212 is formed at the other end of the top encasement half 100 carrying a recessed plate 70 with the trademark 80 formed thereon. Likewise, recessed ridges 90A and 90B are formed on opposite sides. For purposes of reference, the front of power supply 10 is termed 216A and the rear of power supply 10 is termed 216B. An angled region 218 exists between the first plateau 210 and the second plateau 212. The rear 216B is taller than the front 216A as clearly shown in FIG. 2.

Locator tabs 220A and 220B are formed near the rear 216B of the bottom encasement half 110. Directly opposite locator tabs 220A and 220B are tabs 222A and 222B. Tabs 222A and 222B are located near the front 216A in the interior 224 of the bottom encasement half 110. On sides 226A and 226B are located additional tabs 228A and 228B. The locator tabs 220 and the other tabs 222 and 228 serve to seat the PC board 230 in a manner that will be subsequently described. Additionally, opposing snaps 234A and 234B are found on opposing sides 226A and 226B of the bottom encasement half 110. These snaps 234 function to firmly apply opposing side pressure to the PC board 230 to entrap the PC board in place as will be subsequently discussed. In the rear 216B of the bottom encasement half 110 are two formed half-circular openings 236 and 238. Corresponding openings (not shown) are formed at the top encasement half 100.

The pre-assembled PC board 230 has the hand and/or machine loaded components placed on the upper surface thereof. The components, for example, include the connectors 60, the light 50, the slide switch 40, a transformer 240, the snap-in cable connectors 250, and of course the auxiliary power cable 20 and the power cord 30. Cable 20 is designed to fit in the formed opening 238 of the top and bottom encasement halves, and the power cord 30 has a rubber seal 32 that engages circular region 236 formed also in the top and bottom encasement halves.

It is to be expressly understood that the components in the PC board 230 may comprise any conventional design and that the design of the actual power supply is not important to the teaching of the present invention. Likewise, the presence of a switch 40, a light 50, and one or more connectors 60 is in the matter of design choice. Furthermore, whether a single power cord 30 exists or whether the optional auxiliary power cord 20 is provided (or, indeed, other power cables) under the teachings of the present invention is a matter of choice.

3. Snapped Together Encasement Halves

Figure 3:
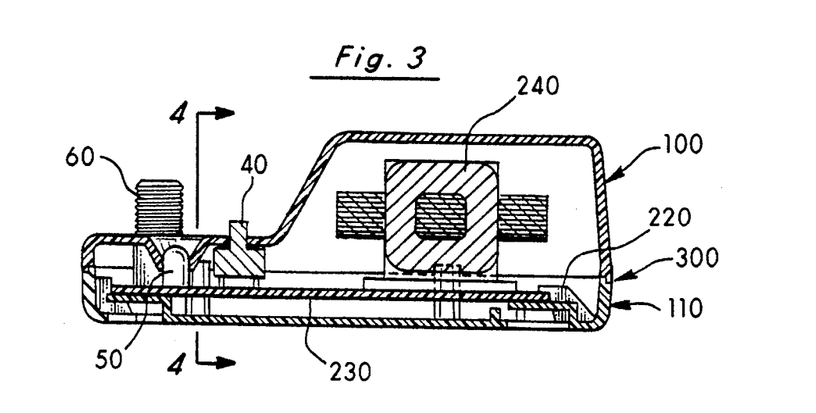
FIG. 3 is a center-line cross-section of the power supply of FIG. 1.

In FIG. 3, the power supply 10 of the present invention is shown through a center-line section. FIG. 3 illustrates how the top encasement half 100 fits together with the bottom encasement half 110 in a tongue-and-groove design around the perimeter between the two encasement halves as indicated by arrow 300. As will be more fully explained subsequently, the PC board 230 is entrapped within the two encasement halves and will not jiggle loose or free from the entrapment.

Figure 4:
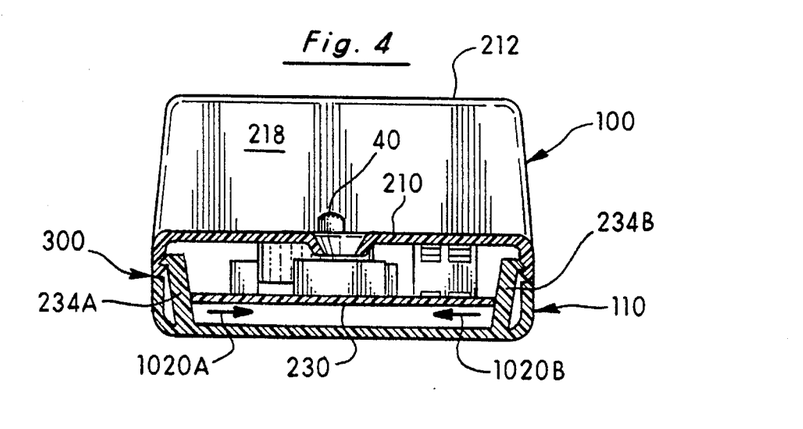
FIG. 4 is a cross-section through the snaps of the present invention as shown in FIG. 3.

FIG. 4 is a section through a snap 234, which will also be explained in greater detail later. FIG. 4 illustrates how the PC board 230 holds the snaps 234 in place so they do not work loose. Again, this function will be described in greater detail later.

4. Entrapment of PC Board

Figure 6:
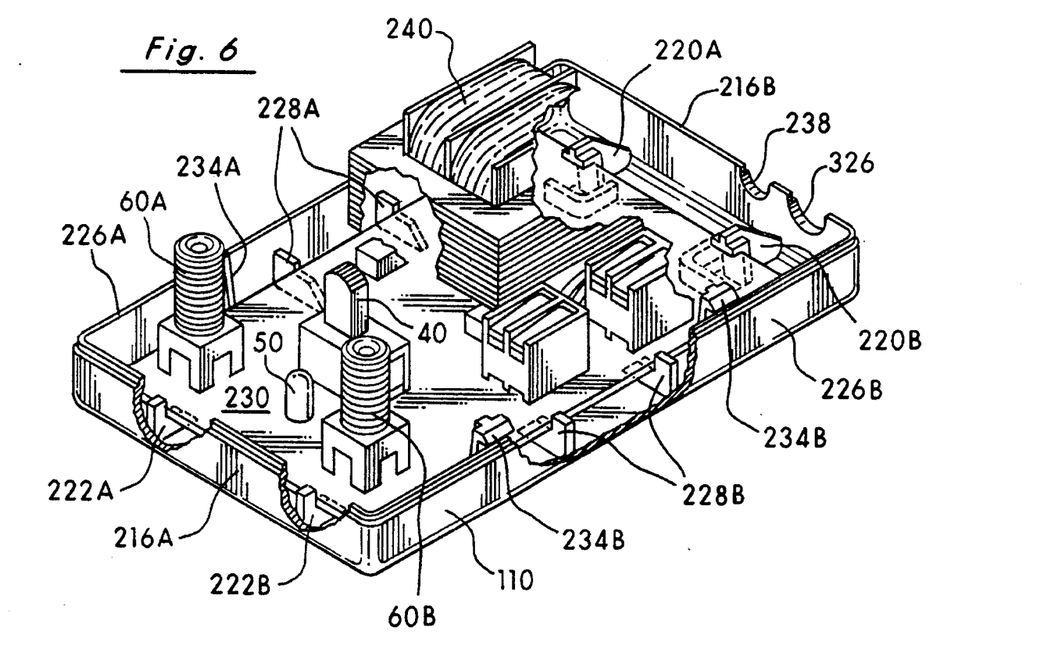
FIG. 6 is a perspective view showing the mounting of the printed circuit board in the bottom encasement half of the present invention.

In FIGS. 6–10, the details of the entrapment of the PC board 230 in the top encasement half 100 and the bottom encasement half 110 are shown. In FIG. 6, the PC board 230 is shown engaging the locator tabs 220 and resting on the remaining tabs 222 and 228.

Figure 7:
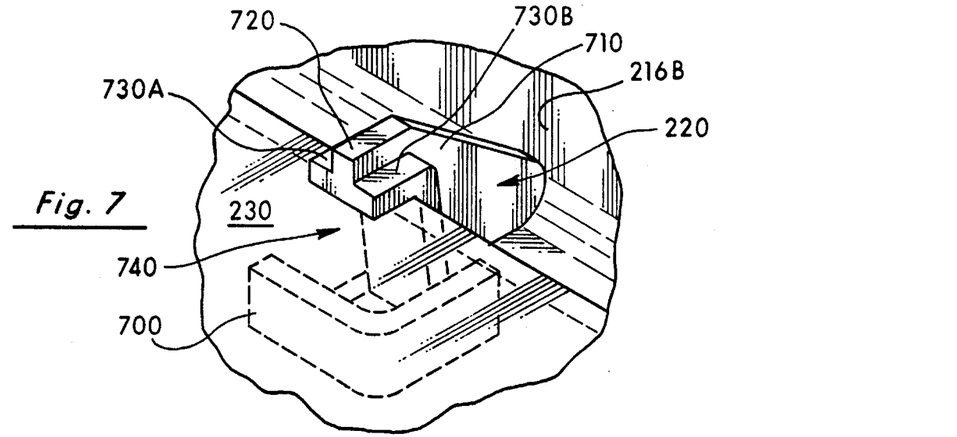
FIG. 7 is a perspective illustration of the locator tab of the present invention.
Figure 8A:
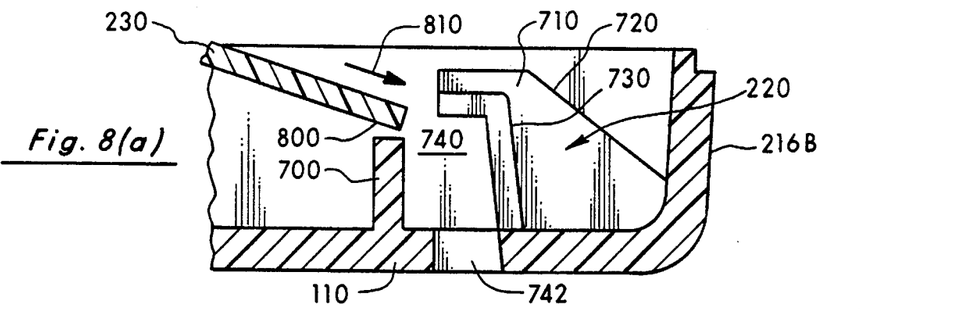
FIGS. 8(a)–8(c) illustrates the steps of the locator tabs engaging and locating the printed circuit board in the bottom encasement half.
Figure 8B:
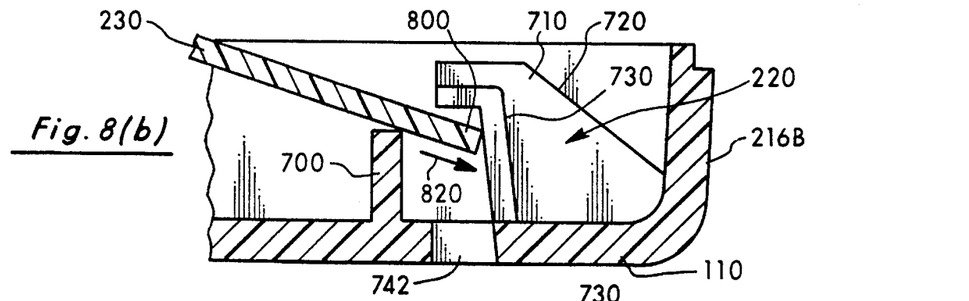
Figure 8C:
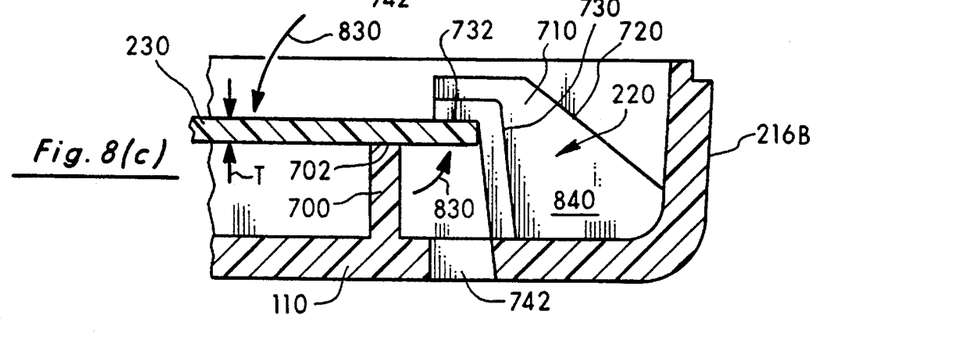

In FIGS. 7 and 8, the details of how the PC board 230 engages the locator tab 220 are illustrated. The locator tab 220 includes a forward L-shaped ridge 700, and a rear cantilevered portion 710. The rear cantilevered portion 710 includes a centrally located rib 720 that is integrally and centrally part of a lower flange 730. Between the flange 730 and the L-shaped ridge 700 is an opening 740. As shown in FIG. 8A, the rear end 800 of the PC board 230 is moved in the direction of arrow 810 toward the opening 740. As shown in FIG. 8B, the end 800 is pushed in the direction of arrow 820 until it abuts the bottom surface of the flange 730. The L-shaped rib 700 acts as a point of pivot so that the PC board 230 is moved in the direction of arrows 830 as shown in FIG. 8C. The distance between the upper surface 702 of the L-shaped rib 700 and the bottom surface 732 of the flange 730 is substantially equal to the thickness, T, of the PC board 230.

As can be easily observed, the locator tab 220 locates the end 800 of the PC board 230 in a precise physical position within the bottom encasement half 110. The L-shaped rib 700 of the locator tab 220 provides support to the bottom of the PC board 230 and protects the PC board 230 from metal objects protruding into the housing through opening 742. The flange 730 has an upstanding center protrusion 720 that provides sufficient structural strength to prevent the end 800 of the PC board 230 from moving upwardly in the vertical direction. Additional structural strength is provided to the locator tab 220 by the substantial body portion 840 of the upstanding protrusion 720 as shown in FIG. 8C so that if the power supply 10 is dropped locator tab 220 will not break off.

The locator tabs 220 function to position one end of the PC board 230 within the lower encasement half 110 precisely so that, as shown in FIG. 6, the end opposing end 800 rests on tabs 222. Side tabs 228A and 228B provide side support and precisely locate the PC board 230 within the lower encasement half 110.

As clearly shown in FIGS. 7 and 8, a locator tab 220 including L-shaped ridge 700 and the cantilevered portion 710 are integrally molded into the lower encasement half 110. It is also to be understood that the locator tab 220 may embrace a number of designs based on the teachings contained herein and still perform the function of precisely locating one end of the PC board within the lower encasement half. It is to be understood that one or more locator tabs 220 could be utilized. For example, three locator tabs 220 could be provided.

Figure 5:
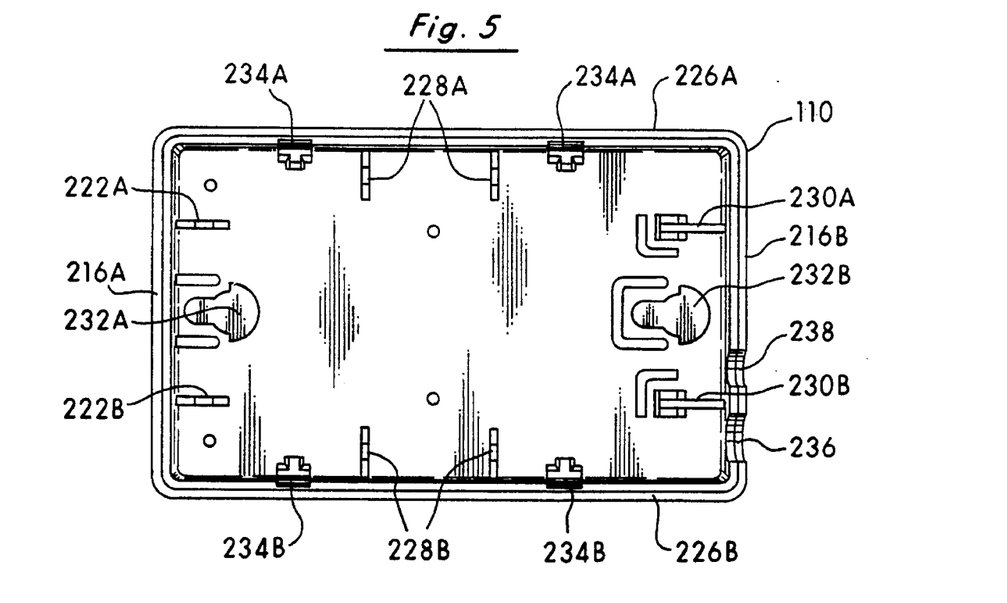
FIG. 5 is a top planar view showing the interior of the bottom encasement half of the present invention.
Figure 9:
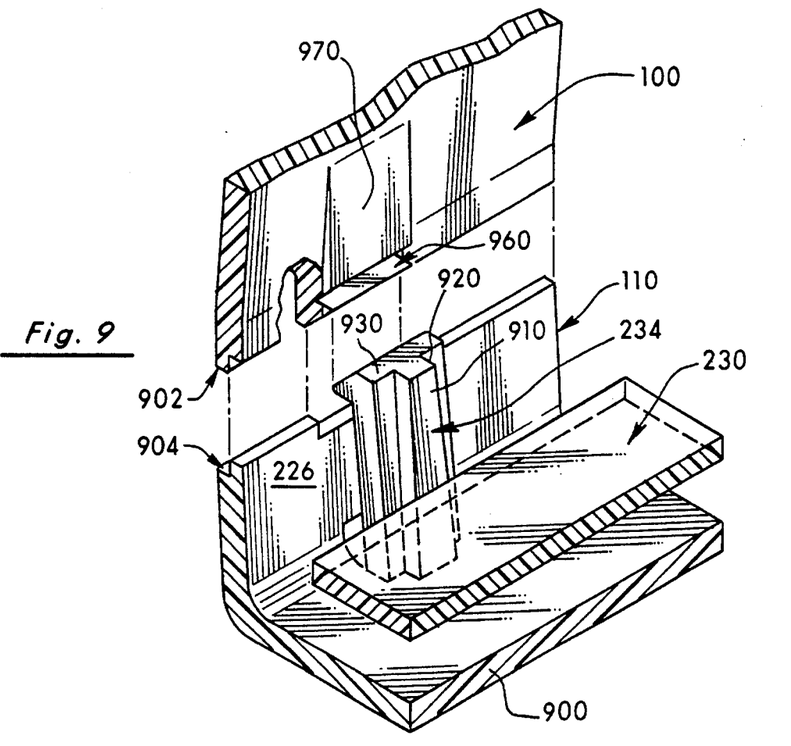
FIG. 9 is a perspective illustration of the snap of the present invention.
Figure 10A:
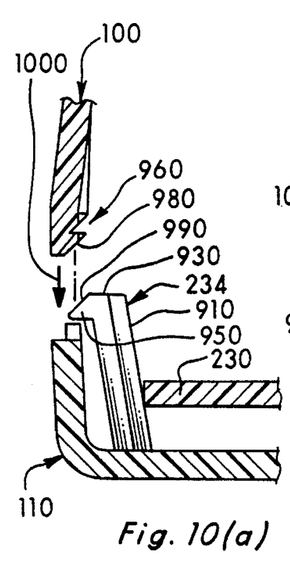
FIGS. 10(a)–10(c) illustrates the steps of engaging the snap of the lower encasement half with the top encasement half to entrap the printed circuit board.
Figures 10B, 10C:
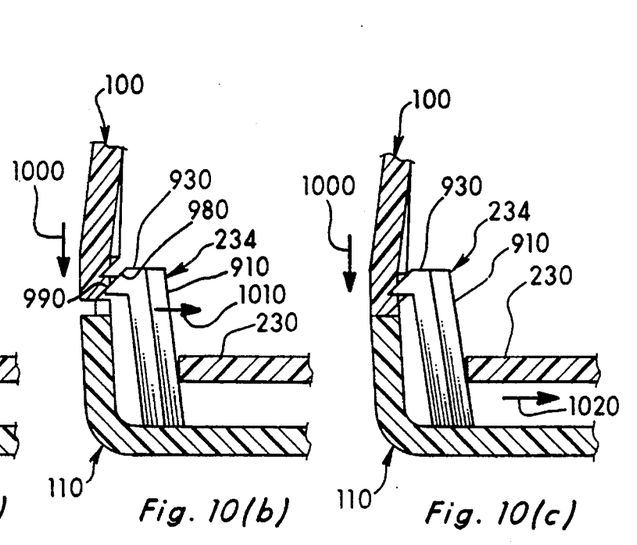
Figure 11A:
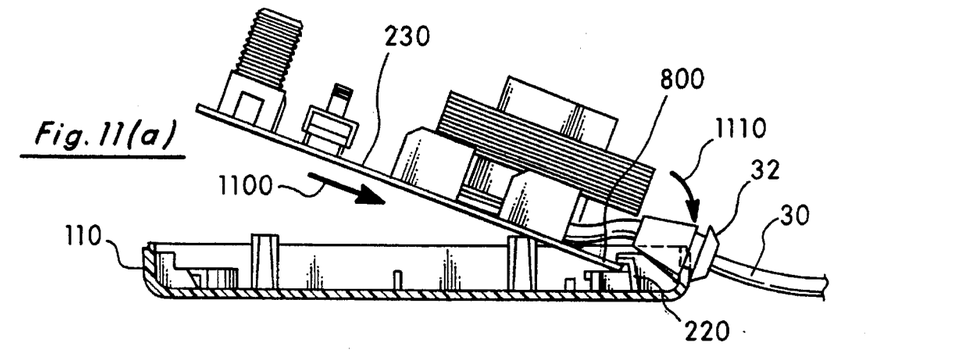
FIGS. 11(a)–11(d) illustrates the steps of assembly required to assemble the amplifier of the present invention.
Figure 11B:
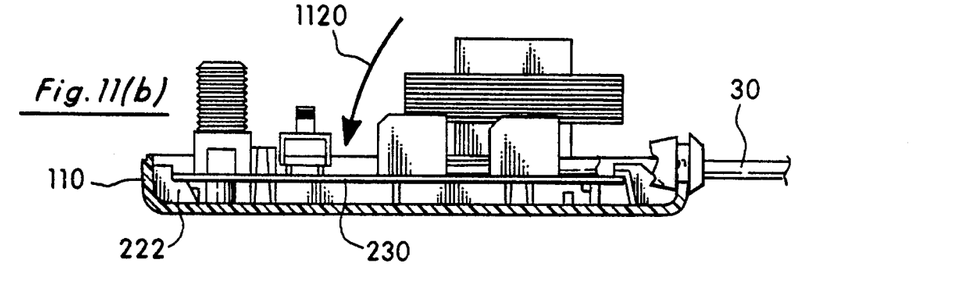
Figure 11C:
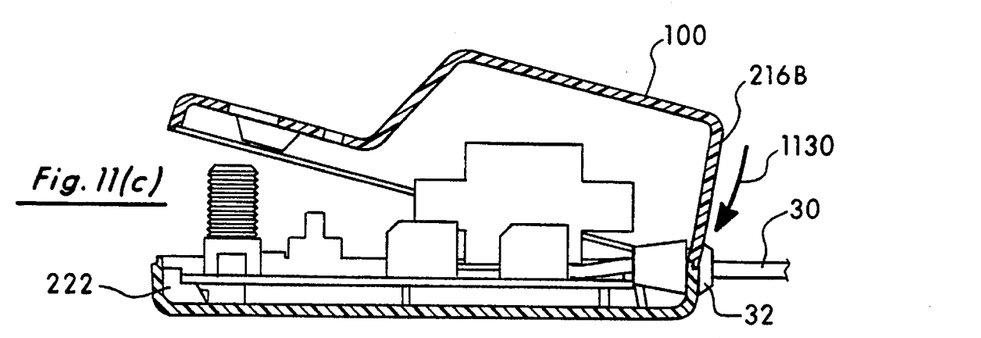
Figure 11D:
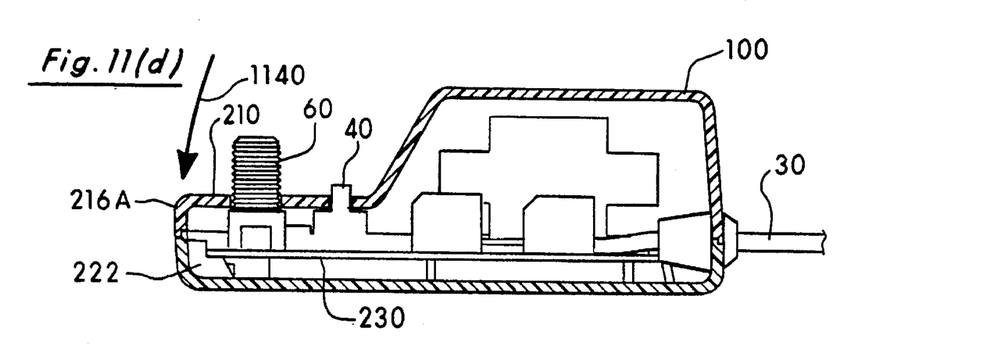

In FIGS. 9 through 10, the details of the operation of the snap 234 of the present invention are shown. As shown in FIG. 5, a total of four snaps 234 are utilized on opposing sides 226A and 226B of the bottom encasement half 110. The details of one snap 234 are set forth in FIGS. 9 and 10. The snap 234 is integrally formed in the bottom 900 of the lower encasement half 110. Snap 234 has a generally upstanding trapezoidal-shaped top portion 910 that is substantially centered on flange 920. The snap 234 has a top surface 930. Outwardly extending from the top 930 toward side wall 226 is a locking protrusion member 950.

Formed in the top encasement half 100 is a corresponding locking grove 960. The groove 960 corresponds in length to the protrusion 950. The groove is formed at the bottom of a platform 970 and is integral with the top encasement half 100.

In FIGS. 7 and 8, the installation of the PC board 230 with respect to the locator tabs 220 is illustrated. Upon insertion, the PC board 230 appears as it does in FIG. 6, resting on the support tabs 228 and 222. As shown in FIG. 10A, when in this position, the circuit board 230 engages the side 910 of the snap 234. As the upper encasement half 100 is pushed in the direction of arrow 1000, the angled surface 980 just below the groove 960 slides along the corresponding angled surface 990 as shown in FIG. 10B. This sliding action causes the snap 234 to move in the direction of arrow 1010 toward the PC board 230. This applies a force on the PC board 230. With continued force in the direction of arrow 1000, as shown in FIG. 10C, the protrusion 950 snaps into the groove 960 in a locking relationship. In this locked engagement, a force is supplied in the direction of arrow 1020 on the PC board 230. This is better shown in FIG. 4 where the forces 1020A and 1020B from opposing snaps on opposite sides of the PC board are directed toward each other. These forces entrap the PC board within the lower encasement half 110. Indeed, the snaps 234 cannot unlock from the upper encasement half 100 since the PC board 230 continually applies a counterforce on snaps 234 to lock the protrusions 950 into the grooves 960.

The tongue 902 in the top half 100 and the groove 904 in the bottom half 110 are clearly shown in FIG. 9.

5. Assembly Process

In FIG. 11(*a*), the details of the simple manufacturing involved are set forth. The power supply 10 of the present invention can be quickly and inexpensively assembled.

In FIG. 11(*a*), the lower encasement half 110 is held. The end 800 of the PC board 230 is inserted into the locator tab 220 as fully explained with respect to FIGS. 7 and 8. The rubber seal 32 for the power cord 30 is inserted into opening 236. At the same time, the optional auxiliary power cord 20 is inserted into opening 230. Hence, the PC board is moved in the direction of arrow 1100 and the seal 32 is inserted in the direction of arrow 1110.

In FIG. 11(*b*), the PC board 230 is moved downwardly in the direction of arrow 1120 to rest on tabs 222 and 228 as shown in FIG. 6. As this point, the PC board 230 is positioned within the lower encasement half 110.

In FIG. 11(*c*), the upper encasement half 100 has its rear 216B fitted over the seal 32 as shown by arrow 1130.

In FIG. 11(*d*), the front end 216A of the upper encasement half 100 is moved in the direction of arrow 1140 so that the four snaps 234 as discussed with respect to FIGS. 9 and 10 become fully engaged, thereby entrapping the PC board 230 within the power supply housing as shown in FIG. 11 and locking the snaps.

It is easily observed that the assembly of the three components (i.e., the upper encasement half 100, the lower encasement half 110, the PC board 230) quickly occurs without the need for any fasteners to hold any of the components together. The plateau 210 is close to the PC board 230 so that the provision of expensive supports or extenders for the switch 40, the F-jacks 60, and the light 50 is eliminated.

The power supply 10 of the present invention is designed to be assembled from the lower encasement half 110 up by simply stacking the PC board 230 and the upper encasement half 100 upon each other. Furthermore, the manufacturing process of printing labels and applying the labels has been fully eliminated by providing region 70 to carry the trademark 80 as part of the plastic injection process. The upper and lower encasement halves 100 and 110 are injected molded in a four cavity tool. The power supply PC board 230 is preferably a single-sided printed circuit board that consists of hand—and machine-loaded components (such as transformer 240) that are wave soldered in place. In the preferred environment, the material for the upper and lower encasement halves is made from polystyrene. It is to be understood that this simple and straightforward manufacturing process for the power supply of the present invention can be adapted to any type of housing suitable for an electronic component. In other words, the quick assembly process of the present invention using tabs and snaps can be used to locate and entrap any type of PC board in a self-locking design. Hence, the present invention is not limited to use with a power supply.

It is to be expressly understood that the claimed invention is not to be limited to the description of the preferred embodiment but encompasses other modifications and alterations within the scope and spirit of the inventive concept.

We claim:

1. A self-locking housing for an electronic circuit, said housing comprising:

a printed circuit board carrying said electronic circuit, said printed circuit board having opposing ends, and opposing sides, a bottom housing, said bottom housing having an interior, opposing ends and opposing sides, at least one pair of opposing bottom snaps, said at least one pair of bottom snaps formed in and integral with one of said opposing sides and said opposing ends in said interior of said bottom housing, a top housing, said top housing having an interior, opposing ends, and opposing sides, at least one pair of opposing top snaps, said at least one pair of opposing top snaps formed in and integral with one of said opposing sides and said opposing ends in said interior of said top housing, said at least one pair of opposing top snaps positioned to lock into said opposing bottom snaps when said top housing is placed over said bottom housing, said locking of said at least one pair of top and bottom snaps forcing said at least one pair of bottom snaps against the opposing sides of said printed circuit board whereby said printed circuit board is entrapped in said housing and whereby said entrapped printed circuit board prevents said at least one pair of bottom snaps from unlocking from said at least one pair of opposing top snaps.

2. The self-locking housing of claim 1, wherein said printed circuit board has the electronic circuit located on the upper surface of said printed circuit board.

3. The self-locking housing of claim 1, wherein said bottom housing and said top housing are made from polystyrene.

4. The self-locking housing for the electronic circuit of claim 1, further comprising at least one cable coupling between said top housing and said bottom housing, said at least one cable connected to said electronic circuit and extending outwardly from said self-locking housing.

5. The self-locking housing of claim 1, further comprising at least one connector affixed to said printed circuit board for extending through a formed hole in said top housing.

6. The self-locking housing of claim 1, further comprising a switch connected to said electronic circuit on said printed circuit board for extending through a formed hole in said top housing.

7. The self-locking housing of claim 1, further comprising a light connected to said electronic circuit on said printed circuit board for extending through a formed hole in said top housing.

8. A self-locking housing for an electronic circuit, said housing comprising:

a printed circuit board carrying said electronic circuit, said printed circuit board having opposing ends and opposing sides, a bottom housing, said bottom housing having an interior, opposing ends, and opposing sides, at least one locator tab placed at one of said opposing ends in the interior of said bottom housing for holding one of said opposing ends of said printed circuit board in a predetermined position in said interior of said bottom housing, at least one end tab placed at the other end of said opposing ends in said interior of said bottom housing, at least one pair of side tabs, each one of said pair placed at one of said opposing sides in said interior of said bottom housing, said at least one end tab and said at least one pair of side tabs supporting the printed circuit board in said bottom housing, at least one pair of bottom snaps, said at least one pair of bottom snaps placed at one of said opposing sides in said interior of said bottom housing, a top housing, said top housing having an interior, opposing ends, and opposing sides, at least one pair of top snaps, said at least one pair of top snaps placed at one of said opposing sides in said interior of said top housing, said at least one pair of top snaps positioned to lock into said bottom snaps when said top housing is placed over said bottom housing, said locking of said at least one pair of top and bottom snaps forcing said at least one pair of bottom snaps against the opposing sides of said printed circuit board whereby said printed circuit board is entrapped in said housing and whereby said printed circuit board prevents said at least one pair of bottom snaps from unlocking from said at least one pair of top snaps.

* * * * *

UNITED STATES PATENT AND TRADEMARK OFFICE
CERTIFICATE OF CORRECTION

PATENT NO. : 5,515,240
DATED : MAY 7, 1996
INVENTOR(S) : RODEFFER et al.

It is certified that error appears in the above-indentified patent and that said Letters Patent is hereby corrected as shown below:

In the drawings, drawing sheet 3 of 6, figure 5, change "230A" to --220A--.

In the drawings, drawing sheet 3 of 6, figure 5, change "230B" to --220B--.

Signed and Sealed this

Eighteenth Day of March, 1997

Attest:

BRUCE LEHMAN

Attesting Officer

Commissioner of Patents and Trademarks